(12) United States Patent
Koops et al.

(10) Patent No.: US 7,435,973 B2
(45) Date of Patent: Oct. 14, 2008

(54) MATERIAL PROCESSING SYSTEM AND METHOD

(75) Inventors: Hans W. P. Koops, Ober-Ramstadt (DE); Peter Hoffrogge, Oberkochen (DE)

(73) Assignees: Carl Zeiss NTS GmbH (DE); NaWoTec GmbH (DE)

( * ) Notice: Subject to any disclaimer, the term of this patent is extended or adjusted under 35 U.S.C. 154(b) by 0 days.

(21) Appl. No.: 11/499,776

(22) Filed: Aug. 7, 2006

(65) Prior Publication Data

US 2006/0284090 A1    Dec. 21, 2006

Related U.S. Application Data

(60) Division of application No. 10/923,814, filed on Aug. 24, 2004, now abandoned, which is a continuation of application No. PCT/EP03/01923, filed on Feb. 25, 2003.

(30) Foreign Application Priority Data

Feb. 25, 2002    (DE) ................... 102 08 043

(51) Int. Cl.
*G21K 7/00* (2006.01)
(52) U.S. Cl. .............. 250/441.11; 250/306; 250/310; 250/440.11; 250/492.2; 250/492.3
(58) Field of Classification Search ............ 250/441.11, 250/306, 307, 310, 311, 440.11, 492.1, 492.2, 250/492.3
See application file for complete search history.

(56) References Cited

U.S. PATENT DOCUMENTS 4,319,570 A    3/1982    Grane 4,330,707 A * 5/1982 Manzke ............... 250/311

(Continued)

FOREIGN PATENT DOCUMENTS

DE    38 90 362    10/1989

(Continued)

OTHER PUBLICATIONS

Shinji Matsui, et al., "Direct Writing onto Si by Electron Beam Stimulated Etching," Applied Physics Letters, vol. 51, No. 19, Nov. 9, 1987, pp. 1498-1499.

(Continued)

*Primary Examiner*—Jack I. Berman
*Assistant Examiner*—Michael J Logie
(74) *Attorney, Agent, or Firm*—Jones Day

(57) ABSTRACT

A material processing system for processing a work piece is provided. The material processing is effected by supplying a reactive gas and energetic radiation for activation of the reactive gas to a surrounding of a location of the work piece to be processed. The radiation is preferably provided by an electron microscope. An objective lens of the electron microscope is preferably disposed between a detector of the electron microscope and the work piece. A gas supply arrangement of the material processing system comprises a valve disposed spaced apart from the processing location, a gas volume between the valve and a location of emergence of the reaction gas being small. The gas supply arrangement further comprises a temperature-adjusted, especially cooled reservoir for accommodating a starting material for the reactive gas.

20 Claims, 5 Drawing Sheets

U.S. PATENT DOCUMENTS

| | | | |
|---|---|---|---|
| 4,698,236 A | | 10/1987 | Kellogg et al. |
| 4,823,006 A | * | 4/1989 | Danilatos et al. ............ 250/310 |
| 4,926,054 A | * | 5/1990 | Frosien ................... 250/396 R |
| 4,930,439 A | * | 6/1990 | Sato et al. ............... 118/723 FI |
| 5,055,696 A | | 10/1991 | Haraichi et al. |
| 5,147,823 A | | 9/1992 | Ishibashi et al. |
| 5,148,024 A | | 9/1992 | Watanabe |
| 5,188,705 A | | 2/1993 | Swanson et al. |
| 5,196,102 A | | 3/1993 | Kumar |
| 5,229,607 A | | 7/1993 | Matsui et al. |
| 5,273,849 A | | 12/1993 | Harriott et al. |
| 5,342,448 A | | 8/1994 | Hamamura et al. |
| 5,358,806 A | | 10/1994 | Haraichi et al. |
| 5,429,730 A | | 7/1995 | Nakamura et al. |
| 5,435,850 A | | 7/1995 | Rasmussen |
| 5,442,183 A | * | 8/1995 | Matsui et al. .......... 250/441.11 |
| 5,482,802 A | | 1/1996 | Celler et al. |
| 5,591,970 A | | 1/1997 | Komano et al. |
| 5,616,921 A | | 4/1997 | Talbot et al. |
| 5,639,699 A | | 6/1997 | Nakamura et al. |
| 5,645,897 A | | 7/1997 | Andra |
| 5,683,547 A | | 11/1997 | Azuma et al. |
| 5,747,818 A | | 5/1998 | Cecere |
| 5,799,104 A | | 8/1998 | Nakamura et al. |
| 5,821,017 A | | 10/1998 | Thomson et al. |
| 5,827,786 A | | 10/1998 | Puretz |
| 5,828,064 A | * | 10/1998 | Knowles ..................... 250/310 |
| 5,851,413 A | | 12/1998 | Casella et al. |
| 5,885,654 A | | 3/1999 | Hagiwara et al. |
| 5,911,711 A | | 6/1999 | Pelkey |
| 5,989,779 A | | 11/1999 | Hatakeyama et al. |
| 6,039,000 A | | 3/2000 | Libby et al. |
| 6,042,738 A | | 3/2000 | Casey, Jr. et al. |
| 6,159,641 A | | 12/2000 | Baum et al. |
| 6,182,605 B1 | | 2/2001 | Frosien |
| 6,268,608 B1 | | 7/2001 | Chandler |
| 6,365,905 B1 | | 4/2002 | Koyama et al. |
| 6,590,210 B1 | * | 7/2003 | Essers ........................ 250/310 |
| 6,661,005 B1 | | 12/2003 | Bruenger |
| 6,977,376 B2 | * | 12/2005 | Fukuda et al. ............... 250/310 |
| 2002/0053638 A1 | * | 5/2002 | Winkler et al. ............... 205/306 |
| 2003/0168595 A1 | * | 9/2003 | Danilatos ................... 250/310 |
| 2004/0173759 A1 | | 9/2004 | Koops et al. |

FOREIGN PATENT DOCUMENTS

| | | |
|---|---|---|
| DE | 41 10 118 | 10/1991 |
| DE | 44 21 517 | 1/1995 |
| DE | 43 40 956 | 6/1995 |
| DE | 198 51 622 | 5/2000 |
| DE | 100 42 098 | 3/2002 |
| EP | 0 106 510 A2 | 4/1984 |
| EP | 0 334 680 | 9/1989 |
| EP | 0 477 992 | 12/1995 |
| EP | 1 047 104 | 10/2000 |
| GB | 2 334 373 | 8/1999 |
| JP | 49-38295 | 4/1974 |
| JP | 2-62039 | 3/1990 |
| JP | 03228318 | 10/1991 |
| JP | 6-69111 | 3/1994 |
| JP | 11-354062 | 8/1999 |
| JP | 11-354520 | 12/1999 |
| JP | 2000-149844 | 5/2000 |
| JP | 2001-266784 | 9/2001 |
| WO | 98/22971 | 5/1998 |
| WO | 88/09049 | 11/1998 |
| WO | 99/40234 | 8/1999 |
| WO | 01/03145 | 1/2001 |
| WO | 02/19375 | 3/2002 |

OTHER PUBLICATIONS

Hans W.P. Koops et al., "Constructive three-dimensional lithography with electron-bean induced disposition for quantum effect devices" J. Vac. Sci. Technol. B 11(6), Nov./Dec. 1993, pp. 2386-2389.

U.F.W. Behringer et al., "Repair techniques for silicon transmission masks used for submicron lithography", J. Vac. Sci. Technol. B 4(1), Jan./Feb. 1986, pp. 94-99.

Volker Scheuer et al., "Electron Beam Decomposition of Carbonyls on Silicon", Microelectronic Engineering 5 (1986), pp. 423-430.

H.W.P. Koops, "High-resolution electron-beam induced deposition", J. Vac. Sci. Technol. B 6(1), Jan./Feb. 1988, pp. 477-481.

Peter Gnauck et al., "A High Resolution Field Emission SEM With Variable Pressure Capabilities", Leo 1500VP—Application Paper No. 1, http//www.leo-em.co.uk/SEMIPRODUCTS/1500vp_app01.html.

* cited by examiner

MATERIAL PROCESSING SYSTEM AND METHOD

This application is a divisional of copending U.S. patent application Ser. No. 10/923,814 filed Aug. 24, 2004 now abandoned, which is a continuation of International Application No. PCT/EP03/01923 filed on Feb. 25, 2003, which International Application was published by the International Bureau on Aug. 28, 2003, and which was not published in English. This application also claims the benefit of DE 102 08 043.7 filed on Feb. 25, 2002. The entire contents of each of the above-identified applications are incorporated herein by reference.

BACKGROUND OF THE INVENTION

1. Field of the Invention

The invention relates to a material processing system, a material processing method and a gas supply arrangement for the same, especially for use in methods for processing materials by material deposition from gases, such as CVD (Chemical Vapor Deposition), or material removal involving supply of reactive gases. In particular, the gas reaction resulting in a material deposition or a material removal is induced by a beam of energy which is directed to a portion of the work piece to be processed. The beam of energy may in particular comprise an electron beam, a photon beam or an ion beam.

2. Brief Description of Related Art

Such a conventional system is known from U.S. Pat. No. 5,055,696. In this system, plural reactive gases are selectively supplied to a processing chamber accommodating the work piece to be processed. The reaction of the reactive gases with the work piece is induced by a focused ion beam or photon beam. The thus processed work pieces comprise integrated circuits or photo masks for manufacture of integrated circuits.

The conventional system was found to be unsatisfactory as regards the accuracy with which the processing of the work pieces may be carried out. Equally, it showed that the type of the energy beam and the gas supply used in this conventional system preclude a further reduction of the dimensions of the smallest processable structures.

SUMMARY OF THE INVENTION

The present invention has been accomplished taking the above problems into consideration.

Accordingly, it is an object of the present invention to provide a material processing system, a material processing method and a gas supply arrangement applicable for such purposes which allow to process the work piece to be processed with higher precision.

According to a first aspect, the invention proceeds from a gas supply arrangement comprising at least one gas supply for supplying a reactive gas to a location of reaction in a material processing system. In particular, the reactive gas comprises a so-called "precursor gas" which may be activatable near the location of reaction by means of an energy beam to induce at the location of reaction a material deposition on the work piece to be processed or a material removal from the work piece. To this end, the supply of the reactive gas must be precisely controlled, i.e., a flow of reactive gas must be capable of being switched on and off. To this end, the gas supply comprises a tube having a first inner cross-section in which a valve body for controlling the gas flow can be reciprocated between a first position in which it releases the gas flow and a second position in which it substantially blocks the gas flow. Coupled to the tube is a thin tube or hollow needle which has a smaller cross-section than the tube and serves to deliver the reactive gas near the location of reaction.

According to this aspect, the invention is characterized in that a volume of a coherent gas space extending from the outlet end of the hollow needle to the valve body in the tube is particularly small when the valve body is in its gas flow blocking position. In this case, this volume especially fulfills the relation $V < c*A*l$, wherein A is the area of the inner cross-section of the hollow needle at the outlet end thereof, l is a distance between the outlet end of the hollow needle and the valve body in its gas flow blocking position and c is a constant which is preferably smaller than 5.

To select the volume in such a way is based on the following consideration: When a reaction of the reactive gas with the work piece has taken place to a desired degree, the valve is closed to prevent further reactive gas from being supplied to the location of reaction. However, there is still residual reactive gas present in the volume of the tube and hollow needle between the valve body, in its closed position, and the outlet end of the hollow needle. Such residual gas continues to emerge from the outlet end of the hollow needle for some time. This may cause further, then undesired, depositions of the reactive gases and further reactions of the same with the work piece.

It has already been proposed to dispose the valve particularly close to the work piece to minimize this volume of the gas space between the valve body and the outlet end. In this case, however, space must also be provided near the location of reaction for accommodating the valve. This results into an increased distance between the work piece surface and an optical system for directing the energy beam to the work piece. In some applications, however, it is essential to reduce such distance to achieve a finely focused energy beam.

The inventors have found that such a small distance between the optical system and the work piece can be realized if the gas is delivered through a relatively thin hollow needle to the proximity of the location of reaction. However, a valve having a movable valve body cannot be disposed in such a thin hollow needle. Therefore, the hollow needle is coupled to the tube with the movable valve body disposed therein. The tube which has a considerably larger cross-section than the hollow needle can then be disposed remote from the location of reaction. In this remote position, the necessary space for the, compared to the hollow needle, large valve body is then also available.

In light of this consideration, a gas volume between the outlet end of the hollow needle and the valve body therefore cannot be completely avoided. However, according to the invention, this volume is minimized. This is possible if the above-mentioned relation is complied with.

Preferably, this volume is selected even smaller. In this case, especially $c<3$, preferably $c<1.5$, further preferred $c<1.2$ and even more preferred $c<1.1$. It is then in particular possible to place a plurality of different gas supplies around the location of reaction and to realize a relatively quick and, in terms of time, precise gas flow control for each gas supply by actuation of the respective valve bodies.

According to a particularly preferred embodiment of the invention, the value of constant c is substantially equal to 1.0. This is achievable, for example, if in order to block the gas flow, the valve body is directly urged against an end face of the hollow needle opposite to the outlet end of the hollow needle.

Preferably, the hollow needle has an inner diameter of from 0.3 mm to 2.0 mm, further preferred of from 0.5 mm to 1.7 mm, and particularly preferred of from 0.7 mm to 1.5 mm. Accordingly, the hollow needle has an outer diameter preferably of from 0.6 mm to 2.5 mm, further preferred of from 0.8 mm to 2.0 mm and particularly preferred of from 1.0 mm to 1.8. mm. A preferred length of the hollow needle ranges between 30 mm and 70 mm and particularly preferred between 40 and 60 mm.

Furthermore, the hollow needle can preferably be configured such that an inner cross-section corresponds over a total length of the hollow needle substantially to the inner cross-section of the outlet opening of the hollow needle, i.e., the hollow needle is of substantial tubular configuration. In a further preferred embodiment, the hollow needle is tapered in the portion of the outlet opening, i.e., the inner cross-section in the portion of the outlet opening is smaller than an inner cross-section of a portion between the tapered portion of the outlet opening and the inlet end, the degree of taper being selected such that the above-indicated conditions as regards the volume and the constant c, respectively, are fulfilled. In order to prevent an undesired further flow of reactive gas, it is advantageous to use only a slightly tapered or untapered hollow needle which prevents a back pressure of gas due to an inner cross-section of the outlet opening which is smaller than that of the hollow needle as a whole.

According to a second aspect, the invention proceeds from a gas supply arrangement comprising at least one gas supply which includes a valve body which is displaceable in a tube and is movable between a first position in which it releases a gas flow out of the tube and a second position in which it substantially blocks a gas flow out of the tube. In a preferred embodiment, the valve body is of square cross-section with rounded corners. Accordingly, the valve body with its rounded corners is guided on an inner surface of the tube, whereas between each pair of rounded corners a portion of the valve body has a larger distance from the inner enclosure of the tube to provide four cross-sections for the reactive gas to flow around the valve body in the interior of the tube and to then enter the hollow needle when the valve body is disposed at a distance from the sealing ring. Moreover, a reservoir accommodating a solid or/and liquid starting material for generating the reactive gas is provided. The reactive gas is generated by evaporation, volatilization or sublimation of the liquid or/and solid starting material.

According to this aspect, the invention is characterized in that a temperature-adjusting apparatus is provided for adjusting a temperature of the starting material.

This configuration of the reservoir is advantageous in particular in combination with an on-off valve which, in contrast to a dosing valve, merely assumes a substantially completely closed position and a substantially completely opened position. Accordingly, the reactive gas flow towards the location of reaction can be adjusted by adjusting the temperature of the starting material because the vapor pressure of the starting material is temperature-dependent.

Starting materials are preferably used which have, at a temperature below room, a vapor pressure which is sufficient a vapor pressure to generate a gas flow from the reservoir through the valve to the location of the specimen. The temperature-adjusting apparatus then preferably comprises a cooling device to set the temperature of the starting material below room temperature, at which temperature the vapor pressure of the starting material has a desired value. Examples for such starting materials are: pentabutyl silane or tetrabutyl silane and hydrogen peroxide which can be used in combination to deposit silicon dioxide on the work piece, as well as cyclopentadienyl trimethyl platinum with which a platinum/carbon composite can be deposited on the work piece.

By maintaining the reservoir with the starting material at a temperature which is below the temperature of the other components of the gas supply arrangement, it is largely ensured that reactive gas emerging from the reservoir does not deposit on walls of the other components of the gas supply arrangement.

As an alternative or in addition to a cooling of the starting material, it is preferably also contemplated to heat other components of the gas supply arrangement, such as the hollow needle or the valve body or the tube in which the valve body is movably supported.

In order to adjust the vapor pressure of the starting material in the reservoir to a desired value with increased accuracy, there is preferably provided a pressure sensor for measuring this gas pressure and a controller which, in dependence of a measured pressure signal supplied by the pressure sensor, controls the temperature-adjusting apparatus to change the temperature of the starting material in the reservoir. Preferably, the pressure sensor is coupled to a gas space which comprises the reservoir, the tube in which the valve body is movable and connecting lines therebetween.

According to a further aspect of the invention, there is provided a gas supply arrangement which comprises at least two gas supplies for supplying two different reactive gases to the location of reaction. Accordingly, different starting materials are contained in the respective reservoirs of the at least two gas supplies, which starting materials have specific gas pressures at their operating temperatures.

According to this aspect of the invention, a gas conductance of the hollow needle of each gas supply is adapted to the respective starting material in order to adjust, at a respective prevailing gas pressure, the gas flow through the hollow needle such that a desired amount of gas emerges from the outlet end thereof. In this case, in particular different gas supplies may have different gas conductances of the hollow needles thereof. In particular, the hollow needles of different gas supplies may have different inner cross-sections or/and different lengths.

In particular, it is provided for that for two starting materials of which a first starting material has a higher vapor pressure at a specific temperature, such as room temperature, than a second one of the two starting materials the gas conductance of the hollow needle for delivering the first starting material is lower than the respective gas conductance of the hollow needle for delivering the second starting material.

In particular, in combination with the embodiment in which a temperature-adjusting apparatus is provided for adjusting the temperature of the starting material this allows to realize a coarse adjustment of the gas flow by appropriately adjusting the gas conductance of the hollow needle and to realize a fine adjustment of the gas flow by adjusting the temperature of the starting material.

According to a further aspect, the invention proceeds from a material processing system comprising a processing chamber, a work piece holder for holding a work piece to be processed in the processing chamber, a gas supply arrangement for supplying at least one reactive gas to a portion of the work piece to be processed, and an apparatus for directing an energy beam to the work piece portion to be processed to induce the reactive gas to react with the work piece at this location.

According to this aspect of the invention, an electron beam is used as energy beam which is generated by an electron microscope. The electron microscope also allows to take electron-microscopic images of the work piece. This is primarily done in an operating mode in which the reactive gas is not supplied.

Accordingly, the electron microscope is used to obtain electron-microscopic images of the work piece to be processed, on the one hand, and to induce a controlled reaction in such portions of the work piece between the reactive gas supplied and the work piece. Accordingly, the electron microscope is used to perform two tasks. For both tasks the high focusing capacity of the electron beam enabled by the electron beam is utilized. As a result, a high resolution imaging as well as a high resolution processing of the work piece is achieved.

Moreover, while the reactive gas is supplied, it is also possible to utilize a signal of the secondary electron detector of the electron microscope to monitor the material processing, since an intensity of the secondary electrons may change while the reaction takes place and with increasing material deposition on or increasing material removal from the work piece.

In particular, it is then possible to first carry out processing steps on the work piece by supplying gas and directing the electron beam to selected locations of the work piece and then to take an electron-microscopic image of the work piece while the gas supply is switched off and to compare this image with a reference image of the work piece. Those locations of the work piece where the image of the work piece differs from the reference image can then be identified to perform further processing at these locations in a further step by supplying reactive gas.

The use of the electron microscope for imaging and for the activation of the gas reaction is particularly advantageous if the work piece to be processed is a mask for use in a lithographic process, because in such a process particularly high resolution material processing manipulations have to be performed on the mask. This combination is of particular advantage if the mask is a phase shifting mask (phase mask, PSM). In contrast to the ion beam which is conventionally used to initiate the gas reaction and which also causes ions to be implanted in the mask, the electron beam does not result into implantations or similar changes of the mask material. Such implantations should be avoided in phase shifting masks, because the implanted materials themselves have a phase shifting effect on the radiation used in the subsequent lithographic process for illuminating the mask.

According to a further aspect, the invention proceeds from a material processing system comprising a processing chamber, a work piece holder for holding a work piece to be processed, an electron microscope and a gas supply arrangement for supplying at least one reactive gas. In this embodiment, the electron microscope comprises an electron source for generating an electron beam, at least one focusing lens for focusing the electron beam on an object plane of the electron optics and at least one electron detector for detecting secondary electrons which are generated in a portion around the object plane.

According to this aspect, the work piece holder is configured such that the work piece can be positioned relative to the electron microscope such that a surface of the work piece may be disposed substantially in the object plane of the electron microscope. Furthermore, the gas supply arrangement is disposed relative to the work piece holder such that the reactive gases supplied from the gas supply arrangement emerge near the object plane in a region around the electron beam.

According to this aspect of the invention, the electron microscope comprises at least two pressure diaphragms, each having an aperture for the electron beam to pass therethrough, wherein the pressure diaphragms partially separate three vacuum sections from each other. This is, for one, the vacuum section of the processing chamber in which the work piece is disposed and, for the other, a vacuum section in the interior of the electron microscope in which, inter alia, the electron source is disposed. Furthermore, this is an intermediate vacuum section disposed between the vacuum section comprising the electron source and the vacuum section of the processing chamber. As a result, it is possible to maintain a higher gas pressure in the vacuum section of the processing chamber than in the vacuum section comprising the electron source. The electron source requires a particularly high vacuum for its operation while reactive gases are supplied to the processing chamber which causes a higher gas pressure in the latter. It is likewise possible to provide in the vacuum section comprising the electron source still further vacuum sections separated by pressure diaphragms in order to provide an improved vacuum for the electron source itself.

Preferably, according to this aspect, the electron detector for taking the electron-microscopic images is disposed in the vacuum section. This prevents the detector from being damaged by the in most cases aggressive reactive gases which are supplied to the processing chamber.

Furthermore, a focusing lens of the electron microscope which is disposed next to the object plane is preferably disposed between the detector and the object plane. This enables a particularly small distance to be realized between the focusing lens next to the object plane and the object plane, because the electron detector need not be positioned in a space between the focusing lens next to the object plane and the object plane. Such small working distance allows a particularly fine focusing of the electron beam in the object plane.

Preferably, a separate vacuum pump is provided to evacuate the intermediate vacuum section in a region near the pressure diaphragm. This separate vacuum pump is preferably a turbo molecular pump.

It may be advantageous to separate a limited subsection between the work piece and the electron microscope from the possible vacuum section of the processing chamber. In this case, the at least one reactive gas is then directly supplied to the thus formed subsection. In this subsection, the supplied reactive gas is thus maintained under an increased pressure as compared to the remaining section of the processing chamber and does not flow unhindered into the entire volume of the processing chamber. This allows an economical use of the reactive gas and furthermore a quick adjustment of the desired partial pressure of the reactive gas in the subsection.

In order to form such a subsection, a component of the electron microscope disposed next to the object plane is preferably provided such that it comprises a substantially planar end face which annularly encloses the electron beam and is oriented towards the object plane.

Preferably, this end face is spaced apart from the object plane by a distance of less than 100 µm, preferably less than 50 µm. This allows to separate the subsection sufficiently from the rest of the processing chamber without contact being established between the end face and the work piece to be processed. As a result, increased pressures of the at least one reactive gas can be generated within the subsection.

As an alternative thereto, the component of the electron microscope disposed next to the object plane can also be provided as sealing to abut against the work piece.

According to a preferred embodiment of the invention, the pressure diaphragm itself is positioned between the focusing lens of the electron microscope disposed next to the object plane and the object plane. In this embodiment, the secondary electrons emanating from the object plane travel a comparatively short distance under the bad vacuum conditions prevailing in the subsection before they enter the intermediate vacuum section with a considerably higher vacuum and then the vacuum section including the electron source and are recorded there by the detector.

In addition, a second electron detector can be provided in the processing chamber. The detection signals of the second electron detector are detected especially if the vacuum conditions in the processing chamber are so bad that the first electron detector disposed in the intermediate vacuum section delivers no satisfactory signals.

Preferably, the material processing system comprises a controller for the system to be switched from a first operating mode to a second operating mode. In the first operating mode, the gas pressure in the processing chamber is much lower than in the second operating mode. In the first operation mode, preferably no reactive gas is supplied and, in this operating mode, preferably the electron-microscopic images of the work piece to be processed are generated. In the second operating mode, preferably reactive gas is supplied to the work piece for a material processing to be performed thereon.

The processing space is preferably evacuated by a separate vacuum pump, especially a turbo molecular pump, the pump being preferably inoperative in the second operating mode.

BRIEF DESCRIPTION OF THE DRAWINGS

The forgoing as well as other advantageous features of the invention will be more apparent from the following detailed description of exemplary embodiments of the invention with reference to the accompanying drawings, wherein.

DETAILED DESCRIPTION OF EXEMPLARY EMBODIMENTS

Figure 1:
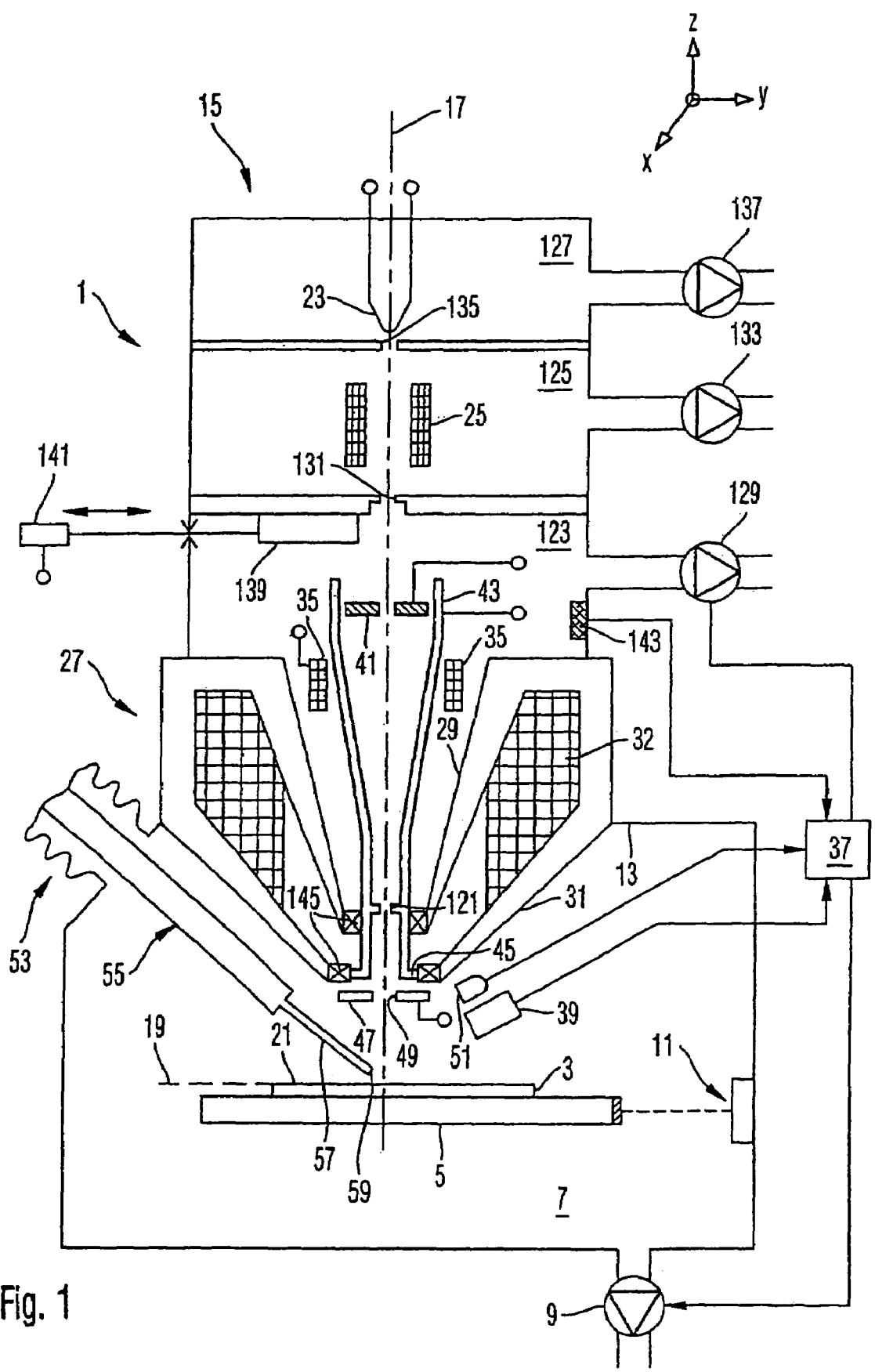
FIG. 1 is a schematic representation of an embodiment of a material processing system having a gas supply arrangement.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 schematically illustrates an embodiment of a material processing system 1 according to the invention. This system is used to process a work piece 3, namely a phase mask. This photo mask serves for use in a photolithographic process and carries structures which are photographically transferred to a radiation-sensitive layer (resist) with which a semiconductor substrate (wafer) is coated. In relation to the wavelength of the light used to transfer the structures from the mask to the semiconductor substrate, the critical dimensions of the structures are relatively small. Therefore, the structures on the mask are not merely embodied as alternately transparent and absorbent structures, but shall also provide a defined phase shifting effect for the light used for the imaging process. Accordingly, the structures of the mask 3 must relatively precisely comply with predetermined limits for location-dependent material densities.

The material processing system 1 allows to produce such structures by material deposition at selected locations or also by material removal from selected locations.

The material deposition is effected herein by supplying a reactive gas (precursor) to the proximity of the location selected for processing. At the same time, an electron beam of primary electrons is directed to the selected location. Primary electrons, or backscattering or secondary electrons released from the work piece by the primary electrons, activate the reactive gas so that components of the reactive gas are deposited at the selected location or in close proximity thereto. As a result, the desired material deposition is effected in the area of the selected location.

The material removal is effected in similar way. However, a different reactive gas is supplied which is activated by the primary electrons or backscattering or secondary electrons generated by the primary electrons such that the reactive gas reacts with the material of the work piece at the selected location or in close proximity thereto and converts components of the material to a gaseous or vapor compound which escapes from the work piece. Thus, the desired material removal is achieved in the area of the selected location.

To this end, the work piece 3 is fixed to a work piece holder 5. The work piece holder 5 and the work piece 3 are disposed in a processing chamber 7 which may be evacuated by means of a turbo molecular pump 9 and a further pre-vacuum pump not shown in FIG. 1.

A spatial position of the work piece holder 5 relative to the processing chamber can be changed in the three spatial directions x, y, z by means of actuators not shown in FIG. 1. Plural laser interferometers 11 are provided to detect the position of the work piece holder 5 relative to the processing chamber 7.

An electron microscope 15 is mounted in a vacuum enclosure 13 of the processing chamber 7 such that the optical axis 17 of the electron microscope 15 extends in z direction and an object plane 19 of the electron microscope 15 is within the processing chamber 7. The work piece holder 5 is positioned within the processing chamber 7 such that a surface 21 of the work piece 3 is disposed substantially in the object plane 19 of the electron microscope 15.

The electron microscope 15 comprises an electron-emitting electron source 23 and a magnetic coil 25 acting as a condenser to form an electron beam from the emitted electrons. The electron beam is directed downwardly along the axis 17. An objective lens 27 of the electron microscope 15 comprises an upper pole piece 29 and a lower pole piece 31, a coil 32 being provided therebetween. The pole pieces define a pole piece gap towards the axis 17. The objective lens 27 focuses the electron beam in the object plane 19.

Furthermore, deflection coils 35 are provided to deflect the electron beam from the optical axis 17 of the electron microscope 15 into x and y directions. A controller 37 controls a current passing through the deflection coils 35 and thus the deflection of the electron beam in x and y direction.

A secondary electron detector 39 is disposed in the processing chamber 7 between the objective lens 27 and object plane 19. The detection signal of the secondary electron detector 39 is read out by the controller 37. To take an electron-microscopic image of the work piece 3 in a portion disposed in the object plane 19 around the axis 17, the controller 37 controls the deflection coils 35 such that the electron beam systematically scans the portion. The intensities recorded by the detector 39 in dependence of the deflections are stored by the controller 37 for further processing, or displayed on a display.

A further secondary electron detector 41 which is likewise read out by the controller 37 is disposed within the electron microscope 15 concentrically around the axis 17 thereof. This detector is disposed within a beam tube 43. The beam tube is symmetrically disposed about the axis 17 and is conically tapered downwardly. The beam tube 43 terminates in a collar 45 in the direction of the object plane 19 at the height of the end of the lower pole piece 31. The collar 45 extends radially away from the axis. An apertured electrode 47 is provided between the collar 45 and the object plane 19. The aperture of the apertured electrode has a diameter of 5 mm. Voltage sources, not shown in FIG. 1, which are controllable by the controller 37 are provided to apply adjustable electric potentials to the beam tube 43 and the apertured electrode 47. In one operating mode of the system 1 in which relatively good vacuum conditions with a gas pressure of less than $10^{-3}$ mbar prevail in the processing chamber 7, the potential of the beam tube 43 is 8 kV and the apertured electrode 47 is at ground potential. Accordingly, an electric field is generated between the collar 45 and the apertured electrode 47. This electric field, on the one hand, decelerates and focuses the primary electrons of the electron beam and, on the other hand, accelerates secondary electrons which emanate from the work piece 3 and travel in a solid angle area surrounding the axis 17 such that the secondary electrons move upwardly along the axis 17 with increased kinetic energy and impinge on the secondary electron detector 41 which records the secondary electrons.

In this operating mode, it is advantageous for the detector 41 to be used for taking the electron-microscopic images of the work piece 3 and to set the other secondary electron detector 39 out of operation. This is because an electrostatic acceleration field which is necessary for the operation of the detector 39 does then not impede the focusing of the primary electrons onto the work piece 3.

Moreover, it is possible to dispose the secondary electron detector in the processing chamber 39 at a position which, although not being optimal for the operation of the detector, allows to provide a relatively small distance between the apertured electrode 47 and the object plane 19. This, in turn, enables the electron beam to be particularly finely focused in the object plane 19 and thus a particularly high position resolution of the electron microscope 15.

In addition to the electron detectors 39 and 41, an energy-resolving photon detector 51 is disposed in the processing chamber. The energy-resolving photon detector 51 records X-radiation emanating from the work piece 3 in the region of the axis 17 in energy-resolved manner. By evaluation of the energy spectra of the X-radiation induced in the work piece 3 by the primary electrons, it is possible to obtain information on the material composition of the work piece 3 at the location onto which the electron beam is currently focused.

In addition to the electron microscope 15, a gas supply arrangement 53 is flanged to the vacuum enclosure 13 of the processing chamber 7. This gas supply arrangement 53 comprises plural gas supplies 55, each including a hollow needle 57 for supplying a reactive gas into the processing chamber to the work piece 3. For this purpose, outlet ends 59 of the hollow needles 57 are disposed about 0.5 mm above the object plane 19 and 1 to 2 mm apart from the axis 17.

Figure 2:
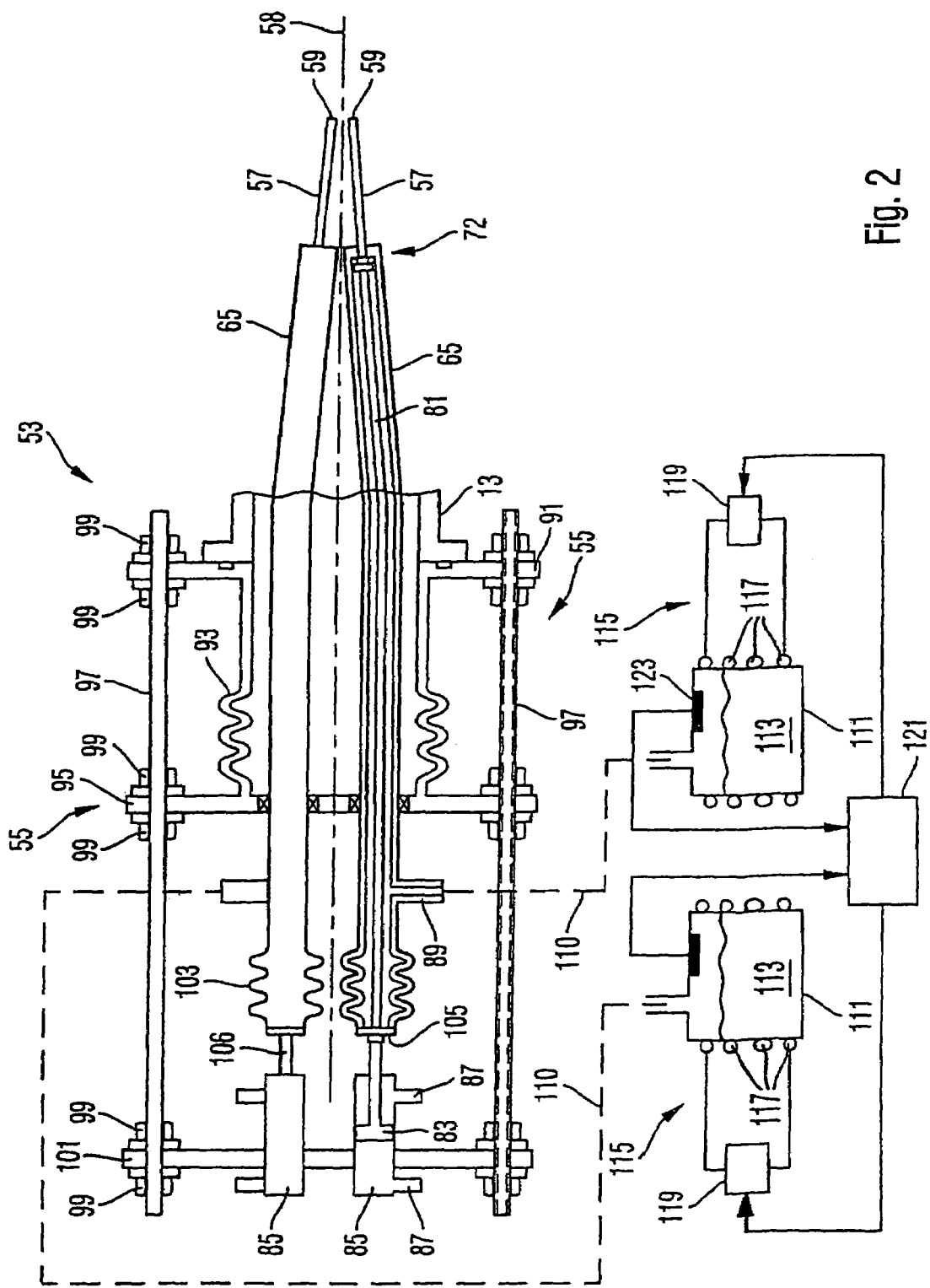
FIG. 2 is a detailed representation of the gas supply arrangement of FIG. 1.
Figure 3:
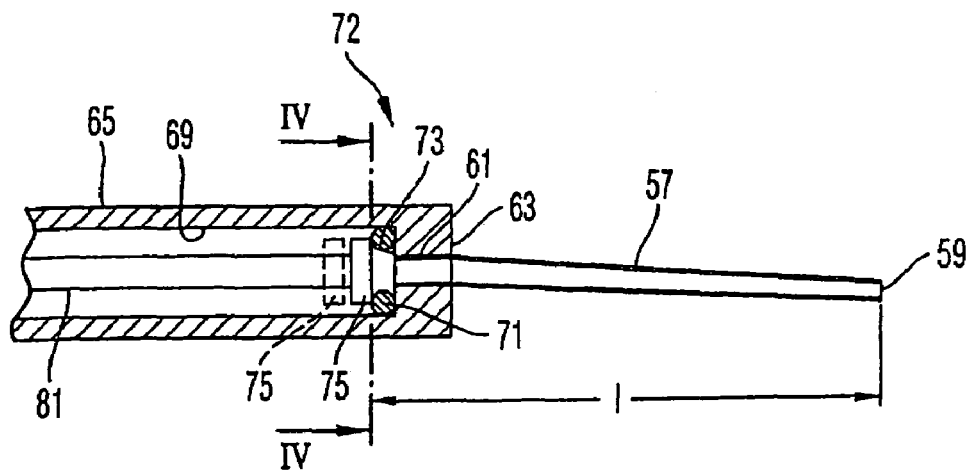
FIG. 3 is a detailed view of FIG. 2.
Figure 4:
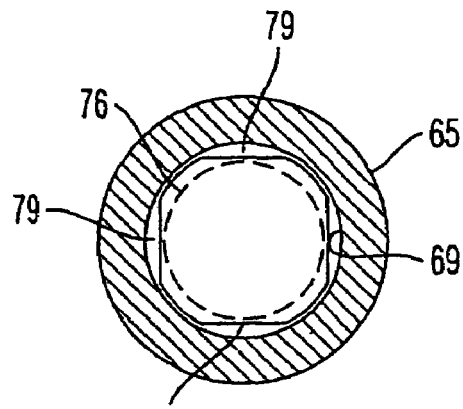
FIG. 4 shows a cross-section along a line IV-IV of FIG. 3.

The gas supply arrangement 53 is shown in detail in FIGS. 2 to 4 and comprises four gas supplies 55 symmetrically arranged about an axis 58. Two of the gas supplies 55 are shown in FIG. 2.

The hollow needles 57 have an inner diameter of 0.7 mm to 1.5 mm and a corresponding outer diameter of 1.0 mm to 1.8 mm. The hollow needle 57 comprises an inlet end 61 which is disposed opposite to the outlet end 59 in the vicinity of the axis 17 of the electron microscope 15 and accommodated in an end wall 63 of a round tube 65. The tube 65 has an inner diameter of 4 mm. An annular sealing ring 71 is provided in the interior of the tube 65. The annular sealing ring 71 abuts both against an inner wall 69 of the tube 65 and against an inner surface 73 of the end wall 63 of the tube.

The sealing ring 71 forms part of a valve 72 which selectively blocks and releases a gas flow from the interior of the tube 65 into the hollow needle 57. In a gas blocking position of the valve 72, a valve body 75 is urged with its end face against the sealing ring 71. A contact surface between the sealing ring 71 and the end face of the valve body 75 is intimated in dashed line 75 in FIG. 4.

In the gas flow releasing position of the valve 72, the valve body 75 is disposed spaced apart from the sealing ring 71, as it is shown in dashed line in FIG. 3.

From FIG. 4 it is evident that the valve body 75 has a square cross-section with rounded corners so that the valve body is guided with its rounded corners at the inner surface 69 of the tube 65. However, between each pair of rounded corners a portion of the valve body 75 is spaced further apart from the inner surface 69 of the tube 65. As a result, four passage cross-sections 79 are formed through which the reactive gas may flow around the valve body 75 in the interior of the tube 65 and then pass into the hollow needle 57 when the valve body 75 assumes its position remote from the sealing ring 71.

The valve 72 is actuated by a rod 81 which extends coaxially to the tube 65. The valve body 75 is fixed to one end of the rod 81. To the other end of the rod a piston 83 is fixed which is movably supported within a pneumatic cylinder 85.

The pneumatic cylinder 85 comprises two compressed-air connections 87. Compressed air can be selectively supplied to the compressed-air connections 87 to urge the valve body 75 either against the sealing 71 for the gas flow into the hollow needle to be blocked or to remove the valve body 75 from the sealing 71 for the gas flow into the hollow needle to be released. The reactive gas is supplied to the interior of the tube 65 via a connection 89 which is inserted into the tube 65 via a T-piece.

A flange 91 for connecting to the vacuum enclosure 13 of the processing chamber 7 encloses the tubes 65 of the four gas supplies 55. One end of a bellow 93 is connected in vacuum-tight manner to the flange 91. The other end of the bellow is connected in vacuum-tight manner to a flange 95 through which the tubes 65 extend separately in vacuum-tight manner. The tubes 65 are also mechanically fixedly connected to the flange 95. Plural threaded rods 97 extend in parallel to the bellow 93 between the flanges 91 and 95. The flanges 91 and 95 are connected to the threaded rods 97 by means of nuts 99. By turning the nuts 99, it is possible to change the distances between the flanges 91 and 95 and thus to adjust the positions of the outlet ends 95 of the hollow needles 57 relative to the object plane 19 and the axis 17 of the electron microscope 15 when the gas supply arrangement 53 is fixed to the vacuum enclosure 13 of the processing chamber 7.

The threaded rods 97 further support a plate 101 to which the compressed-air cylinders 85 for actuating the valves 72 are fixed in position. At their ends disposed away from the hollow needle 57, each tube 65 goes over into a bellow 103 which is closed in vacuum-tight manner by a plate 105. The rod 81 for shifting the valve body 75 is fixed to the plate 105. The plate 105, in turn, is coupled to the piston 83 in the compressed-air cylinder 85 via a rod 106. Accordingly, by actuating the compressed-air cylinder 85, the bellow is expanded or compressed which, in turn, causes the valve body 75 to be shifted in the tube 65 and thus the valve 72 to be actuated.

When the valve 72 is switched at a specific point in time from its opened state into the state in which it blocks the gas flow, it is desirable that, as of this point in time, substantially no reactive gas emerges anymore from the outlet end 59 of the hollow needle 57. However, at the time when the valve is completely closed there is still residual reactive gas present in the space between the valve body 75 and the outlet end 59 of the hollow needle 57. This residual reactive gas will then still emerge from the outlet end 59 of the hollow needle 57 and may thus cause a further reaction with the work piece 3.

However, it is ensured that the volume of the gas space formed between the valve body 75 and the outlet end 59 is relatively small. It should be noted that this space cannot be avoided to have a certain volume, since the reactive gas is supplied to the location of reaction near the work piece 3 by means of the hollow needle 57. The hollow needle 57 must have a specific gas conductance and thus a specific minimum cross-section to allow a desired gas flow towards the work piece 3. However, it is possible for the cross-section of the hollow needle 57 to be smaller than a minimum cross-section of the valve 72. This involves the advantage that no large-volume components, such as the valve body 75, must be disposed in the proximity of the location of reaction.

The valve 72 and its transition to the hollow needle 57 are designed such that, in closed position of the valve 72, the gas space between the valve body 75 and the outlet end 59 of the hollow needle 57 is not considerably larger than the volume of the hollow needle 57 itself. As shown in FIG. 3, the volume of this gas space is comprised of the volume of the hollow needle 57 and a volume which is axially delimited by the inner surface 73 of the end wall 63 of the tube 65, on the one hand, and by the end face of the valve body 75 disposed towards the hollow needle, on the other hand. In radial direction, the gas space is delimited by the sealing ring 71. The small radius of the sealing ring 71 is about 0.5 mm. The inner radius of the sealing ring 71 is about 1.0 mm. Accordingly, the volume between the valve body 75 and the end wall 73 has a value of about 1.5 mm$^3$. With an inner diameter of 1.0 mm and a length of 50 mm, the hollow needle has a volume of about 40 mm$^3$. In total, the volume between the outlet end of the hollow needle 59 and the end face of the valve body 75 in the closed position of the valve 72 is thus 41.5 mm$^3$. The length l indicated in FIG. 3 is the sum of the length of the hollow needle and the small diameter of the sealing ring 71 and is thus about 51 mm.

A value c of a ratio of the volume of the gas space divided by the cross-section of the hollow needle 57 at its outlet end 59 times the length l $$\left(c = \frac{V}{A \cdot l}\right)$$

thus has a value of about 1.05. This means that, in the embodiment of the valve 72 shown in FIG. 3 and its transition into the hollow needle 57, the volume of the gas space between the outlet end of the hollow needle 59 and the valve body 75 in its gas flow blocking position is merely 1.05 times larger than the volume predetermined by the hollow needle 57 itself. Therefore, a period of time during which reactive gas still flows out of the outlet end 59 from the hollow needle in an appreciable amount after the valve has been closed is decreased to a minimum.

The generation of reactive gas will now be described in further detail with reference to FIG. 2.

The connecting piece 89 communicating with the interior of the tube 65 is connected via a hose 110 to a reservoir 111 in which a starting material 113 of the reactive gas is accommodated. A separate reservoir 111 is associated to each gas supply 55. A respective starting material 113 is accommodated in the reservoir 111. The starting material 113 is present in the reservoir 111 in solid or liquid form. The reactive gas is generated by evaporation, volatilization or sublimation of the starting material. When the valve 72 is closed, a partial pressure of the reactive gas is generated in the coherent gas space extending from the reservoir 111 to the valve 72. This partial pressure is substantially equal to the vapor pressure of the starting material 113. When the valve 72 is now opened, the reactive gas starts to flow so that it emerges at the outlet end 59 from the hollow needle 57. This gas flow is substantially limited by the gas conductance of the hollow needle 57, because the cross-section of the hollow needle 57 is substantially smaller than cross-sections of the other components of the gas supply arrangement, such as the cross-section of the tube 65, the cross-section of the connecting piece 89 or of the hose 110.

Under the desired operating conditions, the gas conductance L [l/sec] of a tube having a diameter d [cm] and a length l [cm] can be estimated to be $$L = \frac{12d^3}{l}.$$

Accordingly, the gas conductance of the hollow needle is about $2 \cdot 10^{-2}$ l/sec. If a value of 0.1 mbar is assumed for the gas pressure of the starting material 113, a value of $10^{-3}$ mbar l/sec results for the gas flow Q through the hollow needle into the processing chamber 7. If a value of 100 l/sec is assumed for the effective suction capacity $S_{\mathit{eff}}$ of the turbo molecular pump 9 evacuating the processing chamber 7, a final vacuum in the processing chamber 7 or a partial pressure of the reactive gas will be $$p_{end} = \frac{Q}{S_{\mathit{eff}}} = 10^{-5} \text{mbar.}$$

In the direct environment of the outlet end 59 of the hollow needle 57, the density of the reactive gas will, however, be significantly higher than in other portions of the processing chamber which are remote from the outlet end. Therefore, the outlet end 59 is disposed merely a small distance apart from the location of the work piece 3 to be processed. The electron beam directed to the work piece 3 can then induce the reactive gas to effectively react with the work piece.

In order to be able to control this reaction as precisely as possible, it is thus necessary to also adjust the amount of reactive gas emerging from the hollow needle 57 as precisely as possible.

It has been found that conventional solutions which use dosing valves, such as needle valves, for adjusting the gas flow fail to work satisfactorily, because a dosing behavior of the needle valve changes over time. As a result, the reproducibility of the material processing to be performed on the work piece is unsatisfactory. Therefore, the embodiment shown here does not comprise a dosing valve as valve 72 but an on-off valve which can be switched from a position in which it substantially blocks the gas flow to a position in which it releases the gas flow substantially completely. Although, in so doing, the valve passes for a short time through intermediate positions which more or less release the gas flow, the valve is not designed to finely dose a gas flow.

In the completely opened position of the valve 72, the gas flow through the hollow needle 57 is thus substantially determined by the gas conductance of the hollow needle and the vapor pressure of the starting material 113. At a given geometry of the hollow needle 57, the gas conductance thereof is also predetermined. Therefore, the gas pressure of the starting material 113 must be changed to change the gas flow through the hollow needle 57. To this end, a temperature-adjusting apparatus 115 is provided at the reservoir 111. For this purpose, plural coils 117 of a liquid circuit are provided at the reservoir 111. The liquid circuit is driven by a heating/cooling device 119. The heating/cooling device 119 adjusts the temperature of the liquid passing through the liquid circuit to a value which is predetermined by a controller 121. The controller 121 further reads a signal supplied by a pressure sensor 123 which measures the gas pressure within the reservoir 111. As this gas pressure is substantially determined by the vapor pressure of the starting material 113, the controller 121 will set the heating/cooling device 119 to a higher temperature than a current temperature to increase the temperature of the starting material 113 when the pressure measured by the sensor 123 is lower than a desired vapor pressure of the starting material 113. Vice versa, the controller 121 will set the heating/cooling device 119 to a lower temperature if the pressure measured by the sensor is higher than a desired vapor pressure.

The gas conductance of the hollow needle 57 is adapted to the starting material 113 to be used such that, in order to adjust the desired vapor pressure, the temperature of the starting material 113 is to be set to a lower value than the operating temperature of the apparatus or room temperature. It is also possible for the heating/cooling device 119 to set the temperature of the starting material 113 higher than the operating or room temperature. However, in this case, the reactive gas evaporating or sublimating from the surface of the starting material 113 in the heated reservoir 111 might then deposit on the, compared thereto, colder walls of the gas supply 55. Especially in the interior of the hollow needle 57 which shall provide a defined gas conductance such a deposition of reactive gas results into a reduction of the gas conductance and thus to a deteriorated reproducibility of the results. If, however, as described above, the temperature of the starting material 113 in the reservoir 111 is lower than the temperature of the other walls of the gas supply 55, such a deposition of the reactive gas on the walls of the gas supply 55 is substantially avoided.

The gas supply arrangement 53 shown in FIG. 2 is configured for the ejection of two reactive gases. These gases are induced by the electron beam to react with each other such that a platinum/carbon composite is deposited on the work piece 3 in the portion to which the electron beam is directed. To this end, the reservoir 111 shown on the left in FIG. 2 contains hydrogen peroxide as solid at a temperature of minus 40° C. At this temperature, the vapor pressure of hydrogen peroxide is 0.05 mbar. The hydrogen peroxide is ejected to the location of processing through the upper hollow needle 57 shown in FIG. 2. This hollow needle 57 has an inner diameter of 0.8 mm and a length of 50 mm. The gas conductance of this hollow needle is thus $1.6 \cdot 10^{-3}$ l/sec. Accordingly, when the valve 72 is open, hydrogen peroxide emerges from the outlet end 59 in such an amount that about 52 monolayers of hydrogen peroxide per second can be deposited on the work piece.

The reservoir shown on the right of FIG. 2 contains cyclopentadienyl trimethyl platinum at a temperature of 20° C. at which the vapor pressure is 0.05 mbar. The lower hollow needle 57 shown in FIG. 2 through which this gas flows to the location of reaction has an inner diameter of 1.4 mm and likewise a length of 50 mm. Its conductance is thus $1.6 \cdot 10^{-3}$ l/sec. Under these conditions, the gas cyclopentadienyl trimethyl platinum flows out of the hollow needle in such an amount that a deposition of about 276 mono layers per second would result.

When reactive gases flow out of the gas supply arrangement 53, a vapor pressure which is too high to operate an electron source 23 is generated within the processing chamber. Therefore, a pressure diaphragm 121 is provided inside of the steel tube 43 (see FIG. 1). This pressure diaphragm has an inner diameter of 1 mm for the electron beam to pass therethrough. The pressure diaphragm 121 separates the vacuum section of the material processing system 1 into a vacuum section disposed below the pressure diaphragm 121 and comprising the processing chamber 7 and an intermediate vacuum section disposed above the pressure diaphragm 121. The vacuum section disposed above the pressure diaphragm 121 is further separated into vacuum subsections 125 and 127 which are separately evacuated. The intermediate vacuum section 123 is evacuated by a separate turbo molecular pump 129 and delimited at the bottom by the pressure diaphragm 121 and at the top by a pressure diaphragm 131 having an inner diameter of 500 μm.

The vacuum section 125 is evacuated by an ion getter pump 133 and is delimited at the bottom by the pressure diaphragm 131 and at the top by a further pressure diaphragm 135 having an inner diameter of 80 μm. The vacuum section 127 disposed above the pressure diaphragm 135 is evacuated by a further ion getter pump 137 and includes the electron source 23.

A closure 139 actuated by an actuator 141 is provided to completely close the pressure diaphragm 131. The actuator 141 is controlled by the controller 37 such that the closure 139 is opened only if a pressure sensor 143, read out by the controller 37, records a pressure in the subsection 123 which is less than $10^{-3}$ mbar.

Sealings 145 are provided to seal the pole pieces 29 and 31 against the steel tube 43 so that the coil 32 need not be disposed in a vacuum in respect of the objective lens 27.

By separating the vacuum section of the processing chamber 7 from the vacuum section including the electron source 23 which is again separated into subsections 123, 125, 127, it is possible to operate the electron microscope also when reactive gas is supplied into the processing chamber 7. Accordingly, it is possible for the electron microscope 15 to provide an electron beam which is finely focused to the work piece 3 in order to induce the reactive gas to react with the work piece 3 at selected locations.

Moreover, it is possible to take electron-microscopic images of the work piece 3 by means of the electron microscope 15 and to thus monitor the progress of the processing of the work piece. The electron-microscopic images can be taken when reactive gas is currently not supplied to the vicinity of the processing location. In this case, particularly good vacuum conditions prevail in the processing chamber 7. However, it is also possible to take electron-microscopic images if reactive gas emerges from the hollow needles 59. In this case, however, the electron-microscopic images will be generated with low intensity of the electron beam or with a reduced spatial resolution in order not to induce unnecessary reactions of the reactive gas with the work piece.

Under some processing conditions it is desired to provide a high gas pressure in the processing chamber in order to avoid undesired local electrostatic charges of the work piece 3. The controller 37 then switches the material processing system to an operating mode in which the turbo molecular pump 9 evacuating the processing chamber 7 is set out of operation. The processing chamber 7 is then only evacuated by the pre-vacuum pump not shown in FIG. 1 of the turbo molecular pump 9. In this case, the gas pressure in the processing chamber may increase to about 1 mbar.

In the following, variants of the embodiment explained above with reference to FIGS. 1 to 4 will be described. Those components which correspond to each other as regards their structure and function are designated by the same reference numbers as in FIGS. 1 to 4, however, supplemented by an additional letter for the purpose of distinction. Reference is taken to the entire previous description.

A material processing system 1*a* shown in FIG. 5 again comprises a processing chamber 7*a* in which a work piece 3*a* is disposed on a work piece holder 5*a* such that a surface 21*a* of the work piece 3*a* is disposed in an object plane of an electron microscope 15*a*.

Further, a gas supply arrangement 53*a* is provided to eject plural reactive gases near a location of processing which is disposed in a region around the main axis 17*a* of the electron microscope 15*a*.

The electron microscope 15*a* also comprises a steel tube 43*a* which tapers downwardly and terminates in the direction of the work piece 3*a* in a radially extending collar 45*a*. An apertured electrode 47*a* is again disposed between the collar 45*a* and the work piece 3*a*. In contrast to the above-described embodiment, this apertured electrode 47*a* also serves as pressure diaphragm for separating vacuum sections. To this end, the apertured electrode 47*a* has an inner diameter of 200 µm. Although this small aperture diameter limits the image field of the electron microscope, such a configuration involves other advantages.

The apertured electrode 47*a* extends parallel to the surface of the work piece 3*a* at a distance $d_1$ of 300 µm. The apertured electrode 47*a* is further provided with an annular projection 141 extending spaced apart from the main axis 17*a* of the electron microscope 15*a* and having a planar surface 143 disposed towards the surface of the work piece 3*a* and thus towards the object plane 19*a*. A distance $d_2$ between the planar surface 143 and the specimen surface or object plane 19*a* is 75 µm. Accordingly, a vacuum subsection 143 is formed between the apertured electrode 47*a* and the work piece, in which vacuum section 143 hollow needles 57*a* of the gas supply arrangement 53*a* terminate. To this end, the hollow needles 57*a* extend through the apertured electrode 47*a* from above. The vacuum subsection 143 is sealed from the other vacuum section of the processing chamber 7*a* by the projection 141. However, a certain leakage rate is provided by the gap $d_2$ between the planar surface 143 and the surface of the work piece 3*a*, as it is intimated by the arrows 147 in FIG. 6.

By separating the vacuum subsection 143, it is possible to provide particularly high partial pressures of the reactive gases for processing the work piece 3*a* and, as a result, to achieve high reaction rates. As the subsection 143 is small as compared to the processing chamber 7*a*, this enables also an economical use of the reactive gas.

Figure 5:
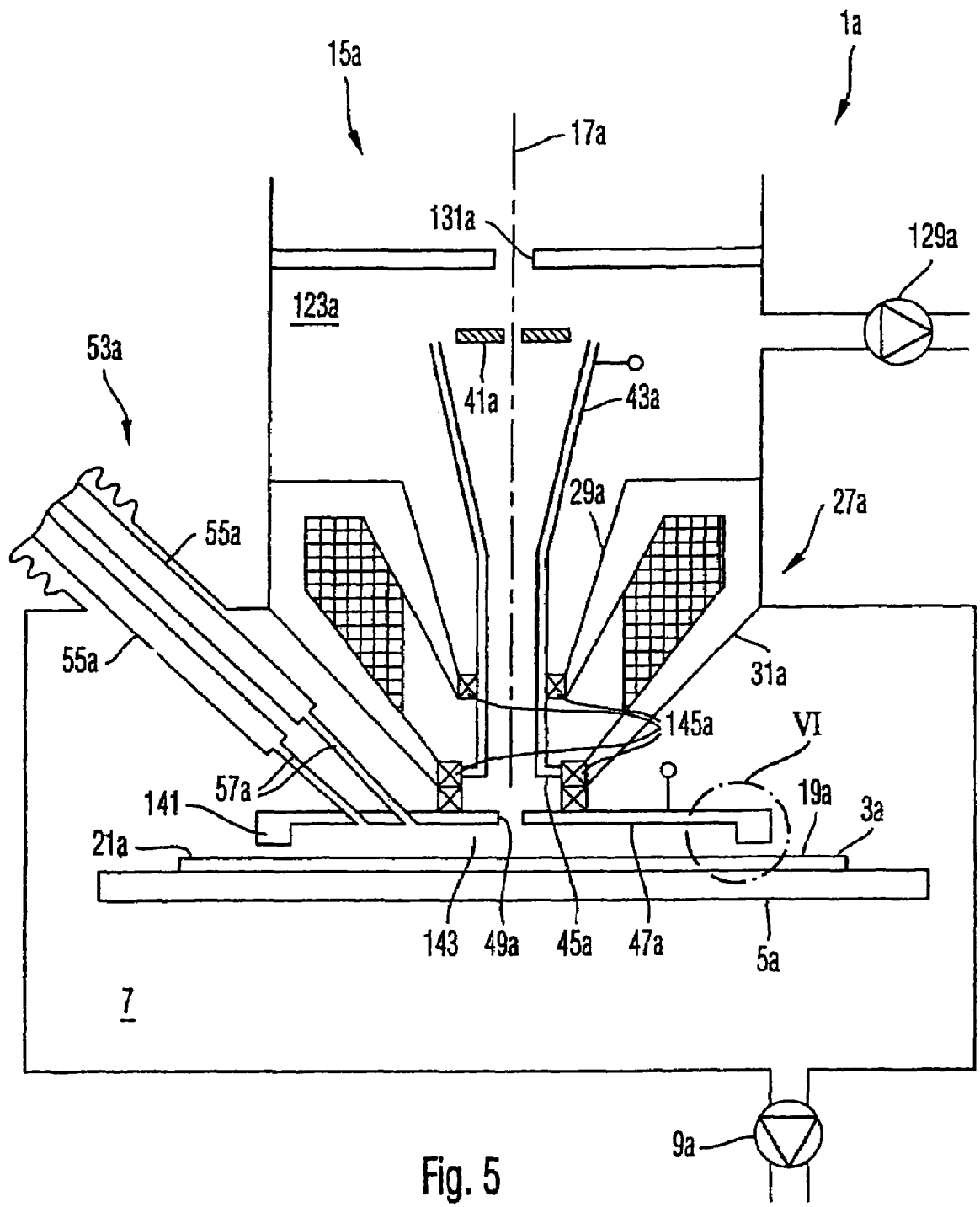
FIG. 5 shows a variant of the material processing system shown in FIG. 1.
Figure 6:
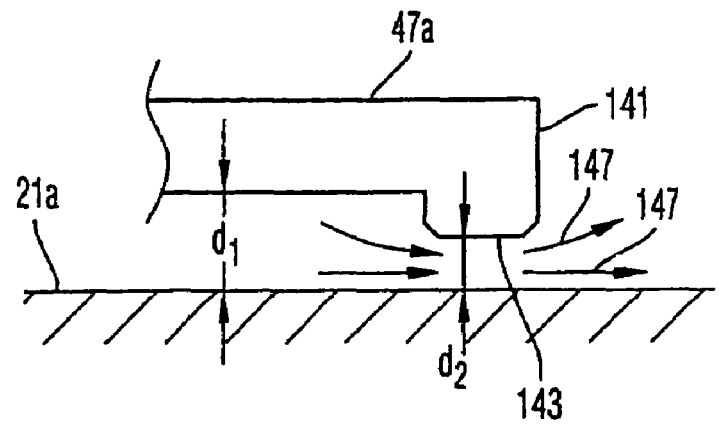
FIG. 6 is a detailed view of FIG. 5.
Figure 7:
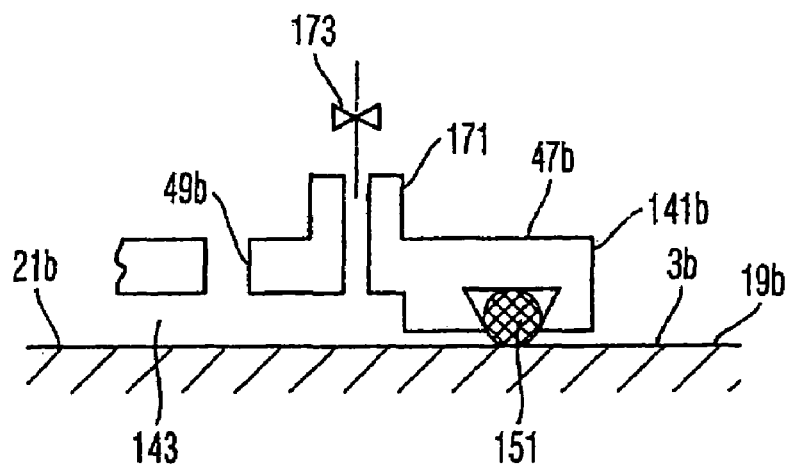
FIG. 7 shows a variant of FIG. 6.

FIG. 7 schematically shows a variant of the embodiment shown in FIGS. 5 and 6. Here, an apertured electrode 47*b* carries at its projection 141*b* protruding axially towards the object plane a sealing ring 151 made of the material "Viton" or another suitable elastomeric material which is suitable for abutment against the work piece. The material of the sealing ring 151 is selected such that the work piece 3*b* is not damaged by a displacement of the work piece relative to the apertured electrode 47*b*.

The subsection 143 can be evacuated in that the work piece holder, together with the work piece 3*b* mounted thereon, is lowered such that a sufficient distance is provided between the sealing ring 151 and the surface 21*b* of the work piece 3*b* to enable the gas to flow out into the subsection 143. Alternatively, it is also possible to provide a connecting suction piece 171 at the apertured electrode 47*b*. The connecting suction piece 171 extends away from the apertured electrode 47 in the direction of the object plane 19*b* and is closed by a switchable valve 173 which, in its opened position, connects the subsection 143 to the vacuum section of the processing chamber and, in its closed position, separates these two vacuum sections from each other.

Figure 8:
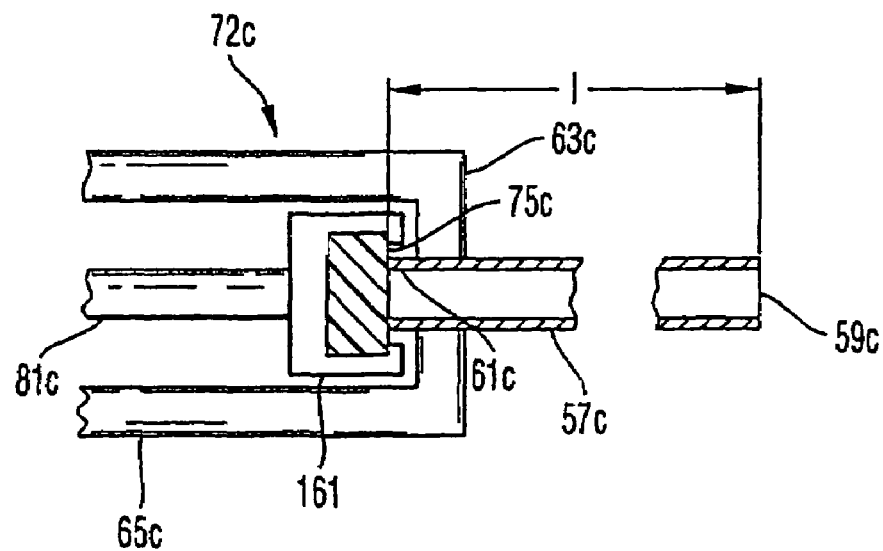
FIG. 8 shows a variant of the portion of the gas supply arrangement shown in FIG. 3.

FIG. 8 shows a variant of a valve of a gas supply arrangement. In contrast to the valve shown in FIG. 3, a valve body 75*c* of a valve 72*c* shown in FIG. 8 directly seals against an inlet end 61*c* of a hollow needle 57*c*. To this end, the valve body 75*c* made of an elastomeric material is embedded in a holder 161 which is connected to a rod 81*c* for actuation of the valve 72*c*. The hollow needle 57*c* projects with its inlet end 61*c* through an end wall 63*c* of a tube 65*c* into the interior of the tube 65*c* such that an end face of the inlet end 61*c* of the hollow needle 57*c* can be brought in direct contact with the valve body 75*c* to block a gas flow out of the interior of the tube 65*c* into the hollow needle 57*c*.

In this embodiment of the valve 72*c*, a magnitude $$c = \frac{V}{A \cdot l}$$

has a value of 1.0, wherein

A is an inner cross-section of the hollow needle 57*c*, l is a distance between the valve body 75*c* and the outlet end 59*c* of the hollow needle 57*c* and V is a volume between the outlet end 59*c* and the valve body 75*c*.

In this embodiment, a residual volume to be emptied after the valve has been closed is reduced to a minimum so that a reaction of the reactive gas with the work piece after the valve 72*c* has been closed is reduced to a minimum as well.

Figure 9:
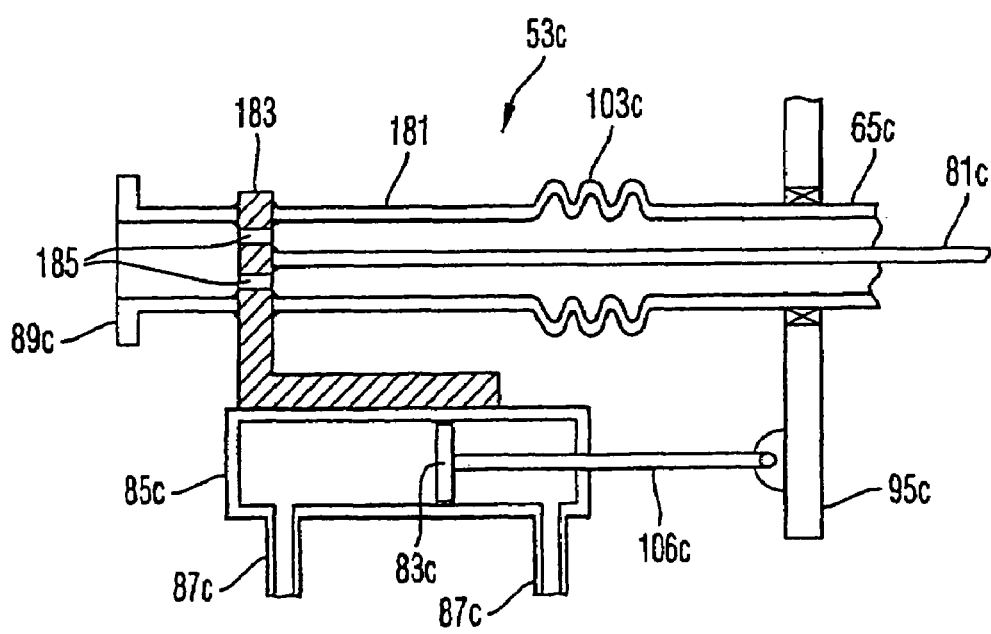
FIG. 9 shows a variant of the gas supply arrangement shown in FIG. 2.

FIG. 9 shows a variant of the gas supply arrangement shown in FIG. 2. In this embodiment, the gas supply into the tube to which the hollow needle is mounted is modified.

In a gas supply arrangement 53*c* shown in FIG. 9, the reactive gas to be supplied is delivered to a tube 65*c* via a connecting piece 89*c*. In the tube 65*c*, a rod 81*c* is held for actuation of a valve body not shown in FIG. 9. The tube 65*c* extends through a flange 95*c* and is mechanically fastened to the same.

One end of the tube 65 is connected in vacuum-tight manner to a bellow 103*c*. The bellow connects over an intermediate tube piece 181 in vacuum-tight manner to a cross beam 183. The intermediate tube piece 181 and the cross beam 183 may be connected, for example, by welding. The rod 81*c* for actuation of the valve body is likewise connected by welding to the cross beam 183 within the tube 65 coaxially to the cross beam 183. The cross beam 183 is fixed to a cylinder 85*c* of a piston cylinder unit, the piston 83*c* of which is coupled via a rod 106*c* to the flange 95*c*. By supplying compressed air via connections 87*c* to the piston cylinder unit, the piston 83*c* can be shifted within the cylinder 85*c*. This likewise causes the rod 81*c* to be displaced within the tube 83*c*, because the bellow 113 is compressible.

The connection 89*c* for the gas to be supplied is likewise connected in vacuum-tight manner on the side of the cross beam 183 disposed away from the intermediate tube piece 181 openings 185 extend through the cross beam such that the gas can pass from the connecting piece 89*c* into the interior of the tube 85*c*.

In the temperature-adjusting apparatus described with reference to FIG. 2, a cooling liquid or heating liquid passes through a plurality of coils and respectively transfers coldness or heat directly to the interior of the reservoir. However, it is also possible to interpose, for example, Peltier elements to achieve even lower temperatures within the reservoir.

The above-described material processing system can be applied as follows. The material processing system is used for processing a work piece, especially for repairing a photo mask. The process is fully automated, preferably by means of a control computer for controlling the components of the material processing system. A photo mask exhibiting defects is first scanned by means of a conventional optical system or an optical system using a corpuscular beam, for example, an AIMS device, to thus determine the coordinates of the mask defects. The data representing these coordinates are input into the control computer and converted in the control computer by means of an input translator of the control computer into a data format suitable for the material processing system. The photo mask to be processed is introduced manually, semi-automatically or automatically into the processing chamber of the material processing system. It is particularly preferred for the photo mask to be transferred to an inlet station of the processing system in a container usually used for the mask transport, such as a so-called "SMF box", by means of a computer-controlled mask loader. The photo mask is then introduced into the inlet station and removed from the container in order to be immediately transferred to the processing chamber of the material processing system or to be placed in an outlet station of the material processing system for further processing. When the photo mask is accommodated in the processing chamber, the defective locations of the photo mask can be located, i.e., positioned into the area of the electron beam, on the basis of the defect coordinates by shifting the work piece holder carrying the photo mask. The position of the work piece relative to the electron microscope is controlled with the aid of the laser interferometers. The electron beam then scans the surface of the work piece to obtain a highly resolved image of the defective location to be currently processed. Furthermore, with the aid of an energy dispersive X-ray detection system (EDX system), a characterization of the materials, especially an element analysis, can be effected at the surface of the defective locations of the photo mask. The imaging and/or EDX analysis can be effected manually, semi-automatically or fully automatically. On the basis of the data determined by the electron optical imaging and/or EDX analysis and a comparison of these data with reference data available in the control computer a magnitude of a defect to be repaired is determined by the control computer. The steps required for repairing the defective dimension are determined by the control computer by allocating the defective dimension to a repair process and repair parameters stored in the control computer. The steps required for repairing the defective location and the parameters of the repair process, especially the selection of the gases to be supplied, the timing of the gas supply, the pointing of the electron beam with a predetermined energy value to the defective location of the photo mask, are preferably performed automatically by the control computer. After the chemical reaction induced by the electron beam at the defective photo mask has been terminated, the thus processed defective location is again electron-optically scanned and imaged. The obtained image is compared with the reference image by means of the control computer, and, in case the images deviate from each other to a predetermined degree, further repair steps are performed or the photo mask repair is terminated and the repaired photo mask is provided as final product of the process for further use.

The above-described system and method are preferably applied for processing and repairing photo masks used in lithographic processes. As already mentioned, the photo mask may be a phase shifting mask.

However, it is also contemplated to process binary masks in which the structures are formed, for example, by portions including chromium which are deposited on a glass substrate or $SiO_2$ substrate. These masks can also comprise so-called "proximity corrections", i.e., particularly small structures which are resolvable by means of the electron microscope.

However, other work pieces, such as micro-mechanical components or the like, can also be processed with the system.

It is also contemplated to use the above-described gas supply not only in combination with an electron microscope but also in combination with other energy beams, such as ion beams or photon beams.

Further, the above-described technique wherein the reservoir for the starting material is cooled can also be used in gas supplies which do not use a hollow needle or which do not comprise an on-off valve, but, for example, a dosing valve.

In summary, a material processing system for processing a work piece is provided. The material processing is effected by supplying a reactive gas and energetic radiation for activation of the reactive gas to a surrounding of a location of the work piece to be processed. The radiation is preferably provided by an electron microscope. An objective lens of the electron microscope is preferably disposed between a detector of the electron microscope and the work piece. A gas supply arrangement of the material processing system comprises a valve disposed spaced apart from the processing location, a gas volume between the valve and a location of emergence of the reaction gas being small. The gas supply arrangement further comprises a temperature-adjusted, especially cooled reservoir for accommodating a starting material for the reactive gas.

The present invention has been described by way of exemplary embodiments to which it is not limited. Variations and modifications will occur to those skilled in the art without departing from the scope of the present invention as recited in the appended claims and equivalents thereof.

What is claimed is:

1. A material processing system, comprising:
    a processing chamber;
    an electron microscope, having an electron source for generating an electron beam, at least one focusing lens for focusing the electron beam in an object plane within the processing chamber, and at least one electron detector for detecting electrons emanating from the object plane; and
    a work piece mount configured for mounting a work piece to be processed in the processing chamber such that a surface portion of the work piece substantially coincides with the object plane of the electron microscope;
    wherein the electron microscope comprises at least first and second pressure diaphragms, each having an aperture for the electron beam to pass therethrough, wherein the first pressure diaphragm partially separates a vacuum section of the processing chamber from an intermediate vacuum section, wherein the second pressure diaphragm partially separates the intermediate vacuum section from a vacuum section accommodating the electron source;

wherein the system further comprises a pumping arrangement having a first vacuum pipe communicating the intermediate vacuum section with a first vacuum pump of the pumping arrangement, and wherein a first electron detector of the electron microscope is accommodated in the intermediate vacuum section;

wherein a focusing lens of the electron microscope disposed next to the object plane is disposed between the first electron detector and the object plane, wherein the first pressure diaphragm of the electron microscope is disposed next to the object plane and comprises a substantially ring-shaped projection extending towards the object plane, the aperture of the first pressure diaphragm being located interior to the substantially ring-shaped projection and being spaced apart from the substantially ring-shaped projection, wherein the electron beam traverses the aperture of the first pressure diaphragm; and wherein the system further comprises a gas supply arrangement configured to supply at least one reactive gas into a partially enclosed region formed between the first pressure diaphragm disposed next to the object plane and the work piece, and wherein the work piece mount is configured to hold the work piece such that a gap of less than 100 μm is formed between the substantially ring-shaped projection of the first pressure diaphragm and the work piece such that the proximity of the first pressure diaphragm to the work piece forms said partially enclosed region therebetween.

2. The material processing system according to claim 1, wherein the first vacuum pump communicating with the intermediate vacuum section for evacuating the intermediate vacuum section is a turbo molecular pump, and wherein the pumping arrangement further comprises a second vacuum pipe for communicating die processing chamber with a second vacuum pump, and a third vacuum pipe for communicating the vacuum section accommodating the electron source with a third vacuum pump.

3. The material processing system according to claim 2, wherein the third vacuum pump is an ion getter pump.

4. The material processing system according to claim 1, wherein the first pressure diaphragm is disposed between the object plane and the focusing lens disposed closest to the object plane.

5. The material processing system according to claim 1, wherein the first pressure diaphragm is disposed within the focusing lens.

6. The material processing system according to claim 1, wherein electron microscope comprises a beam tube extending through the focusing lens, and wherein the first pressure diaphragm is mounted to the beam tube.

7. The material processing system according to claim 1, wherein the the first pressure diaphragm disposed next to the object plane includes an electrode extending parallel to the object plane.

8. The material processing system according to claim 1, further comprising a third pressure diaphragm having an aperture for the electron beam to pass through, wherein the third pressure diaphragm subdivides the intermediate vacuum section into a first intermediate vacuum section partially separated from the vacuum section of the processing chamber by the first pressure diaphragm and partially separated from the second intermediate vacuum section by the third pressure diaphragm, and a second intermediate vacuum section which is partially separated from the vacuum section comprising the electron source by the second pressure diaphragm.

9. The material processing system according to claim 1, the gas supply comprising:
  a tube having a first inner cross-section;
  a valve body which can be reciprocated within the tube between a first position in which a gas flow through the tube is allowed and a second position in which the gas flow through the tube is substantially blocked; and
  a hollow needle having an inlet end coupled to the tube and an outlet end;
  wherein the hollow needle has a second inner cross-section in a portion of its outlet end which is smaller than the first inner cross-section and wherein a volume of a coherent gas space, which is defined by at least the hollow needle, the inner cross-section of the hollow needle at the outlet end thereof and the valve body in its second position, fulfills the following relation:

$V < C*A*1$, wherein
  A is an area of the inner cross-section of the hollow needle at the outlet end thereof,
  1 is a distance between the outlet end of the hollow needle and the valve body in its second position, and
  c is a constant less than 3.

10. The material processing system according to claim 1, wherein the first pressure diaphragm has a lateral dimension smaller than a lateral dimension of the work piece mount such that the partially enclosed region formed between the first pressure diaphragm and the work piece has a lateral dimension smaller than the lateral dimension of the work piece mount.

11. The material processing system according to claim 1, wherein the electron microscope is configured such that an optical axis of the electron microscope passes through an opening of the first electron detector.

12. The material processing system according to claim 1, wherein the gas supply arrangement is configured to supply the at least one reactive gas to a surface of the work piece exposed to the partially enclosed region formed between the first pressure diaphragm and the work piece such that a gas pressure within the partially enclosed region experienced by the work piece is higher than a gas pressure in the processing chamber outside the partially enclosed region.

13. A material processing system, comprising:
  a processing chamber;
  a gas supply arrangement;
  an electron microscope, the electron microscope comprising
    an electron source for generating an electron beam,
    a focusing lens for focusing the electron beam in an object plane within the processing chamber, and
    an electron detector for detecting electrons, the focusing lens being disposed between the electron detector and the object plane; and
  a work piece mount configured for mounting a work piece to be processed in the processing chamber such that a surface portion of the work piece is positioned proximate the object plane of the electron microscope;
  wherein the electron microscope comprises a first vacuum section, the first vacuum section being associated with the processing chamber, a second vacuum section in which the electron detector is arranged, and a third vacuum section in which the electron source is arranged;

wherein the electron microscope comprises an electrode having an aperture therein, the electrode being disposed proximate the object plane, the electrode comprising an annular projection extending toward the work piece mount, the aperture of the electrode being configured such that the electron beam can pass therethrough, the aperture of the electrode being located interior to the annular projection and being spaced apart from the annular projection;

wherein the work piece mount is configured to hold the work piece proximate the electrode with a gap formed between the an annular projection and the work piece such that a partially enclosed region is formed between the electrode and the work piece; and wherein the gas supply arrangement is configured to supply a gas into the partially enclosed region formed between the electrode and the work piece.

14. The material processing system according to claim 13, wherein the electrode has a lateral dimension smaller than a lateral dimension of the work piece mount such that the partially enclosed region formed between the electrode and the work piece has a lateral dimension smaller than the lateral dimension of the work piece mount.

15. The material processing system according to claim 13, wherein the electron microscope is configured such that an optical axis of the electron microscope passes through an opening of the electron detector.

16. The material processing system according to claim 13, wherein the gas supply arrangement is configured to supply the gas to a surface of the work piece exposed to the partially enclosed region formed between the electrode and the work piece such that a gas pressure within the partially enclosed region experienced by the work piece is higher than a gas pressure in the processing chamber outside the partially enclosed region.

17. A material processing system, comprising:
a processing chamber;
a gas supply arrangement;
an electron microscope, the electron microscope comprising
an electron source for generating an electron beam,
a focusing lens for focusing the electron beam in an object plane within the processing chamber, and
an electron detector for detecting electrons, the focusing lens being disposed between the electron detector and the object plane; and
a work piece mount configured for mounting a work piece to be processed in the processing chamber such that a surface portion of the work piece is positioned proximate the object plane of the electron microscope;

wherein the electron microscope comprises a first vacuum section, the first vacuum section being associated with the processing chamber, a second vacuum section in which the electron detector is arranged, and a third vacuum section in which the electron source is arranged;

wherein the electron microscope comprises an electrode having an aperture therein, the electrode being disposed proximate the object plane, the electrode comprising a planar surface facing the work piece mount and comprising a projection disposed near a periphery of the electrode, the projection extending away from the planar surface toward the work piece mount, the aperture of the electrode being configured such that the electron beam can pass therethrough, the aperture of the electrode being located interior to the projection and being spaced apart from the projection with a portion of the planar surface being disposed between the aperture and the projection;

wherein the work piece mount is configured to hold the work piece proximate the electrode with a gap formed between the projection and the work piece such that a partially enclosed region is formed between the electrode and the work piece; and wherein the gas supply arrangement is configured to supply a gas into the partially enclosed region formed between the electrode and the work piece.

18. The material processing system according to claim 17, wherein the electrode has a lateral dimension smaller than a lateral dimension of the work piece mount such that the partially enclosed region formed between the electrode and the work piece has a lateral dimension smaller than the lateral dimension of the work piece mount.

19. The material processing system according to claim 17, wherein the electron microscope is configured such that an optical axis of the electron microscope passes through an opening of the electron detector.

20. The material processing system according to claim 17, wherein the gas supply arrangement is configured to supply the gas to a surface of the work piece exposed to the partially enclosed region formed between the electrode and the work piece such that a gas pressure within the partially enclosed region experienced by the work piece is higher than a gas pressure in the processing chamber outside the partially enclosed region.

* * * * *

UNITED STATES PATENT AND TRADEMARK OFFICE
CERTIFICATE OF CORRECTION

PATENT NO. : 7,435,973 B2 Page 1 of 1
APPLICATION NO. : 11/499776
DATED : October 14, 2008
INVENTOR(S) : Hans W. P. Koops et al.

It is certified that error appears in the above-identified patent and that said Letters Patent is hereby corrected as shown below:

Title Pg, Item (73) Assignees:

Delete "NaWoTee GmbH (DE)" and insert therefor --NaWoTec GmbH (DE)--

On page 2, column 2, OTHER PUBLICATIONS

Delete "Hans W.P. Koops et al., "Constructive three-dimensional lithography with electron-bean induced disposition for quantum effect devices" J. Vac. Sci. Technol. B 11(6), Nov./Dec. 1993, pp. 2386-2389" and insert --Hans W.P. Koops et al., "Constructive three-dimensional lithography with electron-beam induced disposition for quantum effect devices" J. Vac. Sci. Technol. B 11(6), Nov./Dec. 1993, pp. 2386-2389.--

Signed and Sealed this

Sixth Day of January, 2009

JON W. DUDAS
*Director of the United States Patent and Trademark Office*